United States Patent [19]

Strenk et al.

[11] Patent Number: 5,646,530
[45] Date of Patent: Jul. 8, 1997

[54] SURFACE COIL FOR HIGH RESOLUTION IMAGING USING A MAGNETIC RESONANCE IMAGING APPARATUS

[75] Inventors: Susan A. Strenk; Lawrence M. Strenk, both of Aurora, Ohio

[73] Assignee: Diagnostic Instruments, Inc., Twinsburg, Ohio

[21] Appl. No.: 530,576

[22] Filed: Sep. 19, 1995

[51] Int. Cl.$^6$ ................................................. G01V 3/00
[52] U.S. Cl. ........................ 324/318; 324/322; 128/653.5
[58] Field of Search ............................ 324/318, 322, 324/314, 307, 309; 128/653.5

[56] References Cited

U.S. PATENT DOCUMENTS

| | | | |
|---|---|---|---|
| 4,817,612 | 4/1989 | Akins et al. | 324/318 |
| 5,357,958 | 10/1994 | Kaufman | 324/318 |
| 5,435,302 | 7/1995 | Lenkinski et al. | 324/318 |

*Primary Examiner*—Louis M. Arana
*Attorney, Agent, or Firm*—Pearne, Gordon, McCoy & Granger

[57] ABSTRACT

The present invention provides an RF receiver coil with improved signal-to-noise ratio (SNR) characteristics, designed to be positionable immediately adjacent to or surrounding the anatomical region of the body of the patient which is desired to be imaged. The surface coil of the invention is designed for use as a signal receiver, for high resolution unilateral imaging of a localized region, with improved penetration depth. The RF surface coil minimizes capacitive coupling to the patient's body, and in conjunction therewith reduces resistive coupling of the coil to the body of the patient. The RF receiver coil of the invention includes at least two turns of an electrical conductor formed in a solenoidal configuration, with the at least two turns being positioned in spaced apart relationship defining an interturn spacing therebetween. Each of the turns of the coil includes a predetermined number of capacitive splits spaced at intervals along the length of the conductor forming the turns. The predetermined number of capacitive splits reduces capacitive coupling of the coil to the body of the patient, and thus, limits the effect of the body on the coil performance.

20 Claims, 6 Drawing Sheets

SURFACE COIL FOR HIGH RESOLUTION IMAGING USING A MAGNETIC RESONANCE IMAGING APPARATUS

BACKGROUND OF THE INVENTION

This invention is generally related to the field of magnetic resonance imaging (MRI) and, more particularly, to a surface coil and method of use with an MRI imaging apparatus to receive NMR signals and produce high resolution images of an examination subject.

In magnetic resonance imaging, it has been found that examination within certain areas of an examination subject by obtaining localized images using surface coils is quite beneficial. Particular areas of the body, such as the eye or orbital region, portions of an extremity such as the wrist or ankle, the TMJ, larynx, or other similar locations of a patient's body, may be imaged locally using an RF surface coil. Various surface coil configurations have been developed, and various attempts have been made to increase resolution of the MR images. MR images must provide high resolution to be useful for medical diagnosis. To produce high resolution images, the sensitivity of the coil and the signal-to-noise ratio characteristics of the surface coil are important.

SUMMARY OF THE INVENTION

Based upon the foregoing, it is a main object of the present invention to provide an RF receiver coil with improved signal-to-noise ratio (SNR) characteristics, and designed to be positionable immediately adjacent to the anatomical region of the body of the patient which is desired to be imaged. The surface coil of the invention is designed for use as a signal receiver, producing high resolution images of a localized region, with improved penetration depth.

A further object of the invention is to provide a surface coil intended for unilateral or bilateral imaging of anatomical areas close to the surface of the skin, in association with a magnetic resonance imaging method.

Another object of the invention is to provide an RF surface coil for receiving magnetic resonance signals which minimizes capacitive and resistive coupling to the patient's body.

The surface coil of the invention may further include redundant safety features, to facilitate use in a position closely adjacent to the body of the patient.

These and other objects of the invention are accomplished by means of a surface coil and its method of use to provide high resolution images of a localized portion of a patient's anatomy by magnetic resonance imaging. The RF receiver coil of the invention comprises at least two turns of an electrical conductor formed in a solenoidal configuration, with the at least two turns being positioned in spaced apart relationship defining an inter-turn spacing therebetween. Each of the turns of the coil includes a predetermined number of capacitive splits spaced at intervals along the length of the conductor forming the turns. The predetermined number of capacitive splits reduces capacitive coupling of the coil to the body of the patient, and thus, limits the effect of an individuals tissue on the coil performance. For use in MR imaging, the surface coil is coupled to a tuning and matching network used to tune the coil to the MR imaging apparatus resonant frequency, and to match the impedance of the coil to the impedance of the coaxial cable and preamplifier forming a part of an RF receiver associated with the MR imager. As a safety feature, the coil configuration may further include circuitry to decouple the coil during the excitation phase of an MR imaging method.

A method of magnetic resonance imaging according to the invention includes the steps of providing an RF surface coil with at least first and second turns formed in a solenoidal configuration, the coil having a longitudinal axis, with at least the first and second turns being spaced apart along the longitudinal axis. For unilateral imaging, the surface coil may be positioned with the first turn of the coil placed immediately adjacent a portion of a body of a patient to be imaged, and at least the second turn positioned at a further distance from the portion of the body being imaged. For bilateral imaging, a portion of the patients body may be placed within the turns of the coil or multiple coils may be used at different positions relative to a part of the body to be examined. Each of the at least first and second turns of the coil configuration include a predetermined number of capacitive splits spaced at intervals along the length of the electrical conductor forming each of the turns. Nuclear magnetic resonance signals are generated in the portion of the body of the patient adjacent to or within the coil, and the signals are received by means of the coil. These signals are utilized to form an image of at least a portion of the patient's body with improved resolution.

DETAILED DESCRIPTION OF THE PREFERRED EMBODIMENTS

Figure 1:
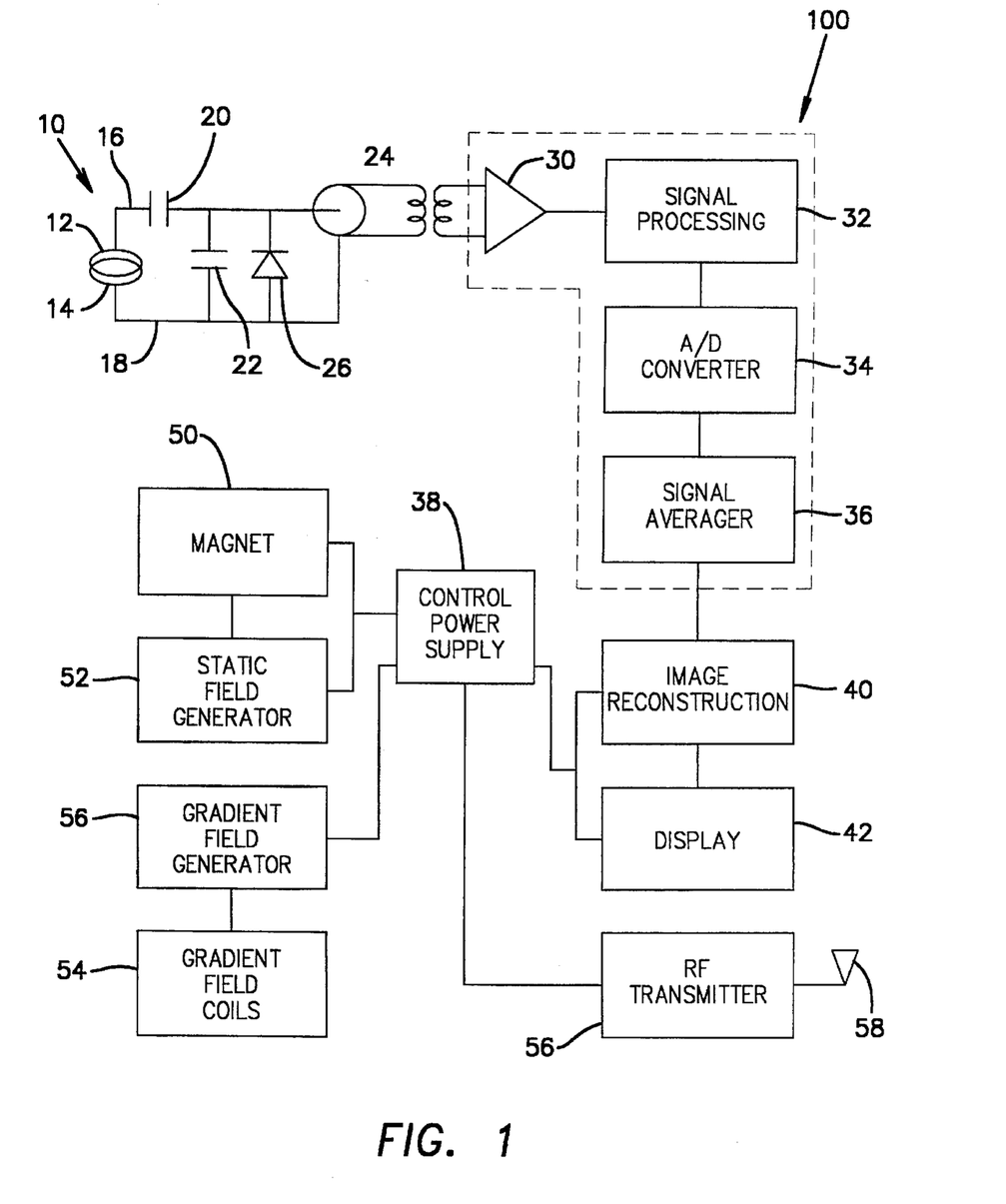
FIG. 1 is a schematic view of a surface coil according to an embodiment of the invention in use with a magnetic resonance imaging system.

Turning to FIG. 1, a radio frequency receiver surface coil 10 in accordance with the first embodiment of the invention includes at least first and second turns 12 and 14 formed in a solenoidal configuration having a longitudinal axis. Coil 10 is formed in the preferred embodiment from a single metallic conductor, such as a copper strip, ribbon, or foil, disposed on a non-metallic circuit board formed of a non-magnetic, polymeric material or other suitable material. In general, and as will be hereinafter described in more detail, the solenoidal coil 10 is designed to be a dedicated surface coil for receiving nuclear magnetic resonance signals from a localized region or regions of a patient's body. The RF receiver coil 10 forms a resonant circuit that receives signals from magnetic dipoles in the body which are oscillating at the resonant frequency as determined by a main magnetic field strength established within an MR imaging apparatus. A dedicated coil, such as an orbital or small parts coil, is designed to maximize this signal by minimizing the distance between the tissue of interest, and each incremental coil element. The RF receiver coil of the present invention is specifically designed to increase the SNR, allowing increased image resolution and decreased scan time.

In the preferred embodiment, the coil 10 includes leads 16 and 18, connected to the ends of the solenoidal coil configuration, which are coupled to a tuning and matching network containing a first capacitor 20 in series, and a second capacitor 22 connected in parallel across leads 16 and 18. The series and parallel capacitors 20 and 22 are used to tune the coil to the resonant frequency of an MR imaging apparatus, and match the impedance of the coil 10 to the impedance of a coaxial cable 24 and the first stage preamplifier 30 of the RF receiver associated with the MR imaging apparatus. As an example, capacitors 20 and 22 may be used to tune the coil 10 to a resonant frequency of any MR imager, and provide a predetermined coil impedance corresponding to the impedance of a half wavelength ($\lambda/2$) coaxial cable and first stage preamplifier. In the preferred embodiment, the magnitude and phase values for the coil are tuned and matched via the network when the loaded phase angle of the coil 10 is substantially 0°, such as within ±10°, and the magnitude is substantially matched to the impedance of the cable 24 and first stage preamplifier 30 in a range of ±10% at the resonant frequency. Transmission line theory dictates that the coaxial cable 24 be either ¼ or ½ wavelength for maximum signal power transfer.

In addition, the tuning and matching network may also include a PIN diode 26, to detune and load the coil 10 during a transmit cycle of an RF body coil used to excite magnetic dipoles in the body at the resonant frequency. In addition, a current blocking circuit may be used to minimize the amount of current flowing through the coil for added safety. Although passive decoupling in this manner is commonly used to inhibit coupling to the imager's transmit coil during an imager's transmit cycle, other decoupling methods, including active decoupling of the coil may be utilized.

The RF receiver coil 10 is used in conjunction with a magnetic resonance imaging apparatus, generally designated 100. The imaging apparatus 100 may include as an example, a radio frequency receiver 28, which includes the first stage amplifier 30 coupled to the coaxial cable 24 for receiving and amplifying magnetic resonance signals received as voltage from the coil 10. The preamplifier 30 may be coupled to a signal processing circuit 32, which may include conventional amplification, filtering and demodulation and/or mixing circuits. The analog voltage signals processed in processing section 32 may then be coupled to an A-to-D converter 34 which converts the signals into digital form for subsequent formation of image information therefrom. Although the coil 10 of the present invention is designed to reduce scan times necessary to achieve high resolution MR images, the MR imager 100 may include a signal averager 36, wherein a plurality of digitized MR image signals can be averaged to improve resolution under certain circumstances. The various circuits of the RF receiver 28 may be coupled to a controller and power supply unit 38, which may include a computer for performing control functions.

The output from the RF receiver 28 is coupled to a unit for image reconstruction 40, with the image thereafter displayed on a suitable video display and/or output to appropriate storage or communication apparatus at 42.

The MR imaging apparatus 100 may further include a large magnet 50 controlled by a static magnetic field generation unit 52. A magnet 50 in association with static field generator 52 forms a substantially uniform static magnetic field $B_o$ within a predetermined space in which a patient's body or a portion thereof is positioned for imaging. The MR imaging apparatus 100 may further include magnetic field gradient coils 54, which typically comprise three sets of coils mounted adjacent the space in which the static magnetic field is generated. Each of the three sets of gradient coils are arranged on different geometric axes. A gradient field generator 56 is provided for selectively energizing the various sets of gradient coils 54, to generate desired magnetic field gradients or variations in the magnitude of the static magnetic field $B_o$ on any one or more of the coordinate axis or in other directions as desired. In addition, the MR imaging apparatus 100 further includes a radio frequency transmitter 56 coupled to a radio frequency antennae coil 58, for generating radio frequency signals at a predetermined resonant frequency for excitation of magnetic dipoles in the body. The components of the MR imaging apparatus 100 are conventional, operation is generally understood by those skilled in the art, and therefore will not be described in more detail.

The radio frequency surface coil of the invention may be used in an imaging method according to one embodiment of the invention, wherein a radio frequency surface coil in accordance with the invention is formed as a solenoidal coil with at least first and second turns and having a longitudinal axis. The at least first and second turns of the coil 10 are spaced apart along the longitudinal axis, and are symmetric about the axis. The surface coil 10 is positioned adjacent to or around a part of the body of a patient. The coil 10 thus is designed as a surface coil, and may be used for multiplanar unilateral imaging of a portion of the body. For unilateral imaging, the first turn of the coil may be positioned immediately adjacent this portion of the body, and the at least second turn of the coil is thus positioned a further distance from the portion of the body. Alternatively, the coil or a set of small coils according tho the invention may be used for bilateral imaging. For example, a portion of the body may be inserted into the coil for imaging. As an example, the breast of a patient may be positioned within the volume of the solenoidal configuration of the coil, with the first turn of the coil positioned adjacent the chest wall of the patient. As another example, two or more small parts coils may be positioned on either side of a patients head to simultaneously image the TMJ region on both sides of the jaw, or on either side of the wrist for imaging thereof. A set of coils may also be used to perform bilateral imaging of other portions of the body. Excitation of magnetic dipoles within the body is created by generation of an RF field at a predetermined resonant frequency corresponding to the MR imaging apparatus 100. Magnetic resonance signals are received by the coil 10, and thereafter an image is reconstructed for at least a portion of the body from which magnetic resonance signals were received.

Figure 2:
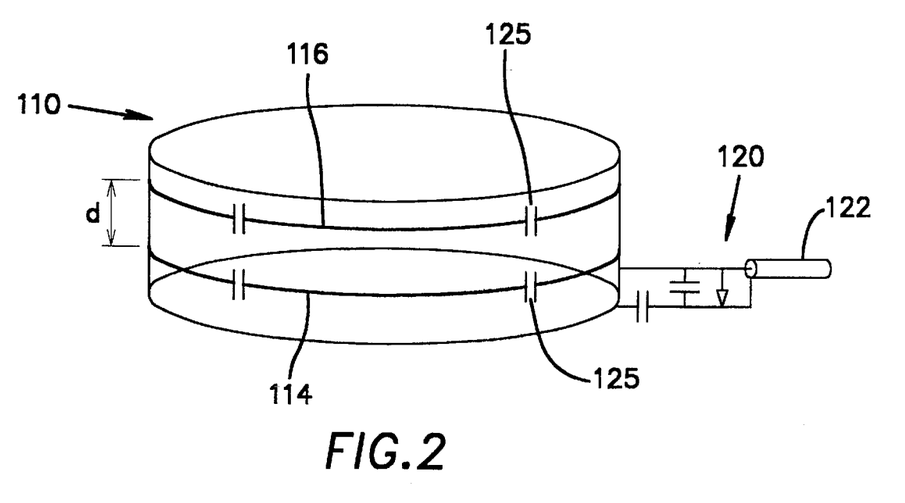
FIG. 2 is a perspective view of an embodiment of the surface coil of the invention associated with a housing, being positionable immediately adjacent the anatomical region of a patient to be imaged.
Figure 3:
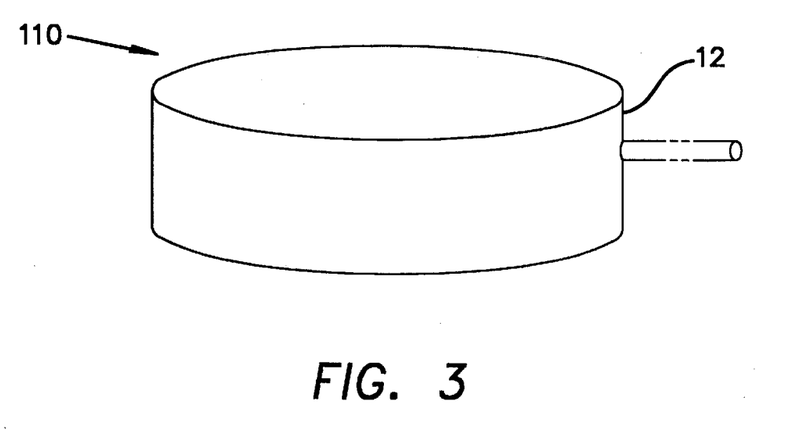
FIG. 3 shows a schematic representation of the surface coil configuration provided in the housing as shown in FIG. 2.

Of particular importance in the present invention are the characteristics of the RF surface coil which improve signal-to-noise characteristics of the coil, to thereby increase resolution of images generated by the MR imaging apparatus 100. Turning to FIG. 2, a first embodiment of the coil 110 according to the invention will be described in more detail. As merely an example, the coil 110 may be designed for proton imaging on MR imaging apparatus 100 operating at 1.5 T. Utilizing the tuning and matching network previously described, the coil can be pre-set and "fixed-tuned" for operation at the resonant frequency of the MR imager. Alternatively, tuning and matching of the coil may be variable to allow selective tuning of the coil. As seen in FIG. 3, the coil generally designated 110, is provided in a housing 112, which may be shaped as a portion of a cylinder or in another shape to closely conform to a small anatomical area. Preferably, the coil is anatomically optimized to allow imaging of small anatomical areas close to the skin of a patient. Such areas may include the eye orbital area, the TMJ, the hand, the wrist, the ankle, the breast or other similar locations. As seen in FIG. 2, the coil is schematically shown to include first and second turns 114 and 116 formed in a solenoidal configuration. The solenoidal coil is formed from a single conductor wound in the solenoidal configuration, with a predetermined inter-turn spacing d, provided between each of the turns 114 and 116. In the preferred embodiment, the coil comprises a double-sided printed circuit board etched in a two-turn solenoidal configuration. In a particular example, the solenoidal coil is formed of a 0.1 mm thick copper conductor wound in the solenoidal configuration with a 3 cm diameter and a 2 mm inter-turn spacing d. The coil may have a diameter between 1.5-10 cm, but other diameters are contemplated. The tuning and matching network previously described, and generally indicated at 120, is contained within the housing 112. The coaxial cable 122 is coupled to the tuning and matching circuit 120 and has the characteristics as previously described. As an alternative to the etching of the conductor from the printed circuit board, a copper foil or other suitable material may be wound about a form of the desired configuration.

The plurality of turns forming the solenoidal coil of the invention, which in this example is two turns, provides increased SNR characteristics. In general, the signal intensity as a function of the distance from a single turn circular surface coil may be defined as:

$$signal(z) = d^2/(d^2+z^2)^{3/2}$$

where z is the perpendicular distance from the plane of the coil, and d is the diameter of the coil. Applying this equation to small surface coils indicates that increasing the coil diameter produces only incremental improvements in SNR near the coil. Conversely, decreasing the coil diameter greatly diminishes the signal obtained from regions farther from the coil. Additionally, as the coil diameter increases, noise from outside the region of interest decreases the SNR. It would therefore be desirable to increase the SNR from deeper lying regions beneath the skin, while not diminishing the SNR from those regions lying more closely to the surface and closer to the surface coil. In the present invention, it has been found that the SNR can be increased significantly by the addition of further turns formed in the solenoidal configuration. To obtain the increase in SNR along with an increase in the number of turns of the coil, a number of capacitive splits, indicated at 125 in FIG. 2, are formed in each turn of the coil 110. The use of the capacitive splits 125 in the manner of the invention, facilitates minimizing capacitive and resistive coupling to the body, which adversely impacts the SNR characteristics of surface coils positioned in closely adjacent positions to the body. Precessing nuclei within the body create a varying magnetic field signal which is induced in a coil according to Faraday's law. For MRI, the signal is produced by precessing hydrogen nuclei. Noise in the coil originates from two sources, the first being the resistance of the coil winding itself, and the second being the resistance of the tissue being imaged. In a well-designed RF receiver coil for use in MRI, the resistance of the coil is a negligible source of noise, so that the tissue resistance would become the dominant source of noise.

Tissue resistance results from oscillating charged particles present in the tissue. Particles produce oscillating electric and magnetic fields which induce both voltage and current in the coil. The addition of a predetermined number of capacitive splits within each turn of the coil in the present invention reduces the effect of tissue generated voltages, and consequently increases the SNR characteristics of the multi-turn coil. Theoretical considerations indicate that the SNR of the multi-turn coil in the present invention increases as the square root of the number of turns in the solenoidal configuration. This can be shown as follows for a solenoidal surface coil with n turns and N capacitive splits, wherein the signal-to-noise ratio is derived from Faraday's laws, the fluctuation dissipation theorem and the observation that the inductance L, of an n turn coil increases as $(L_o n^2)$, where $L_o$ is the inductance of a one-turn coil. The SNR is given as:

$$SNR = \omega^2 (n/N) \phi L_o n^2 / (4k_B T \Delta f) \omega R^{3/2}$$

where $\omega$ is the angular frequency, $\phi$ is the magnetic flux, $k_B$ is Boltzmann's constant, T is the temperature, $\Delta f$ is the bandwidth and R is the series resistance. The resistance is a combination of the resistance $r_c$ of the coil, and the resistance $r_b$ due to conducting currents in the body. When the number of turns and number of splits are taken into account, R is written as:

$$R = nr_o + (n/N)^2 r_b$$

where $r_b$ is found from:

$$r_b = (\sigma/l^2) \int E^2 dT$$

with $\sigma$ as the conductivity of the material, l being a unit current, dT is the differential volume and the electric field E given by:

$$E = -\delta A/\delta t$$

where A is the magnetic vector potential of the oscillating magnetic dipoles. Defining $k = \omega^2 L_o \phi / (4k_B T \Delta f)$, the SNR is rewritten as:

$$SNR = (kn^3 N) / (nr_c + [(n/N)^2 r_b])^{3/2}$$

From the above, when the resistance of the body, $r_b$, is much greater than the resistance of the coil, $r_o$, the SNR = $kN^2$, indicating that without the capacitive splits formed in the coil turns, the addition of turns in the solenoidal configuration would have no beneficial effect on SNR. Although the signal drop-off from the body tissue will increase as the distance of the coil turns from the body increases, significant SNR increases are still obtained by adding more turns with splits.

The number of capacitive splits per turn, N, can be determined by measuring the angular resonant frequency of the coil when the coil is loaded, $\omega_{oloaded}$, and when the coil is not loaded, $\omega_{oempty}$. The increase in capacitance, $\Delta C$, due to loading is given as:

$$\Delta C = C_{tot(empty)}((\omega_{oempty}/\omega_{oloaded})^2 - 1)$$

where $C_{tot(empty)}$ is the series sum of the capacitors in the circuit. The number of capacitive splits per turn, N, is given as:

$$N = (\Delta C/(K\, C_{tot(empty)}))$$

where K is the desired amount of reduction of capacitive coupling with respect to $C_{tot(empty)}$ (for example K=0.01). For the example of the invention as shown in FIG. 2, a two turn 3 cm coil with six capacitive splits was used to obtain SNR ratios on a phantom with a conductivity of normal saline and doped with copper sulfate to obtain a T1 equivalent to fat. Using a standard T1 weighted sequence, the signal-to-noise ratio of the two-turn coil was 116.8, while a corresponding signal-to-noise ratio for a one-turn coil was only 78.1. Thus, for a small coil in accordance with the invention, increasing the number of turns and providing a predetermined number of a capacitive splits per turn effectively increased the SNR, substantially as predicted by theory.

The effect of capacitive splits on the Q of the circuit was also determined for a two-turn 3 cm coil with six capacitive splits, wherein the unloaded Q of the coil was 107, greatly increased from an unloaded Q of 74 for a similar coil design without capacitive splits. The provision of capacitive splits reduces the capacitive coupling between the turns and increases the unloaded Q, as predicted by theory. Further, when the coil is loaded with a phantom containing a physiological saline solution, a loaded Q of 71 was obtained, while a corresponding loaded Q of 38 was obtained for a coil without capacitive splits. The capacitive splits therefore also reduced the capacitive coupling to the phantom, and increased the loaded Q, also as predicted by theory.

Figure 4:
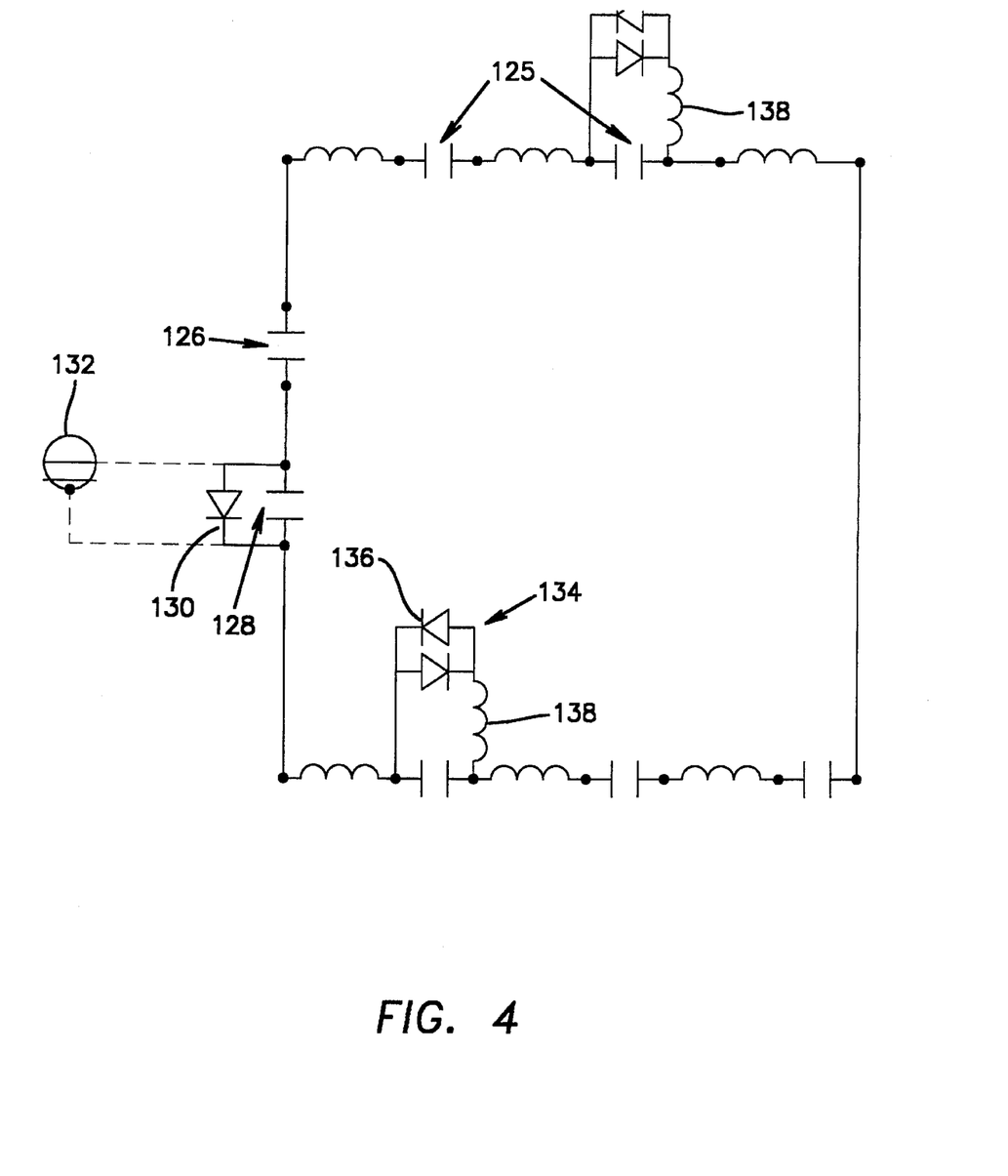
FIG. 4 shows a schematic electrical circuit diagram for the embodiment of the surface coil shown in FIG. 3.

In FIG. 4, the electrical circuit corresponding to the embodiment of the coil in FIGS. 2 and 3 is shown. In the solenoidal configuration, the capacitive splits 125 are formed equidistantly about each turn, thereby effectively splitting the length of the conductor into a number of equal segments and electrically balancing the coil. For the capacitive splits 125, high Q microwave chip capacitors are preferable, which may also be used in the tuning and matching network. As previously mentioned, the tuning and matching network may comprise a capacitor 126 in series and a capacitor 128 in parallel for tuning of the coil to the resonant frequency of the MR imager. A PIN diode 130 passively decouples the coil during RF transmit cycles as previously indicated. The coaxial cable 132 couples the coil to the MR imager through the tuning and matching network. Forming part of the coil circuit, there may also be provided current blocks generally indicated at 134, which minimize currents in the inductor sections. In conjunction with the tuning and matching network, the current blocks 134 greatly improve the safety with which the coil can be used. In this example, a current block is positioned within each turn of the coil, at the location of a capacitive split, and includes a pair of switching diodes 136 and an inductor 138, which together form a high impedance to current in the inductor.

Figure 5:
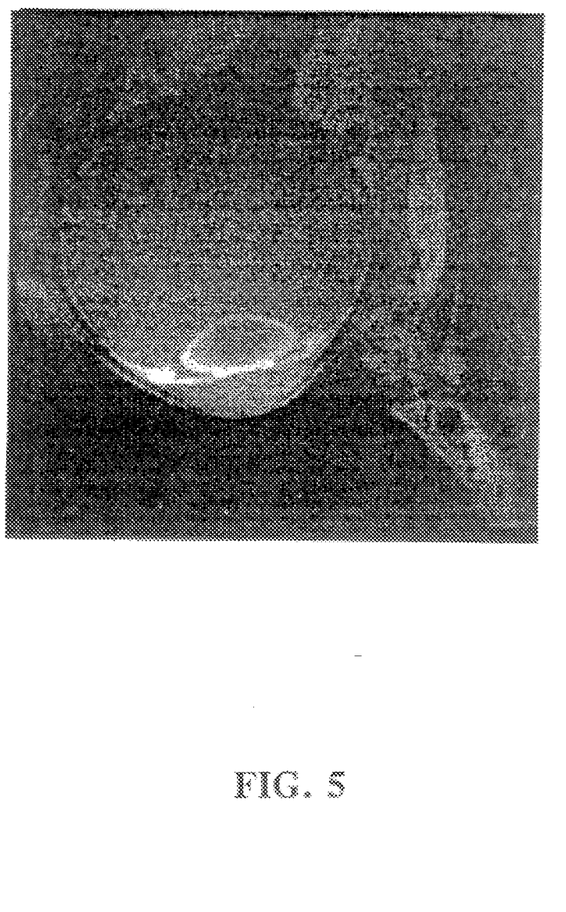
FIG. 5 is an MR image of a patient's orbital region, showing high resolution and visualization of intraocular structures including the iris, ciliary body, lens and choroid, and improved imaging of the retrobulbar region.

As an example of the imaging characteristics achievable with the surface coil of the invention, FIG. 5 shows an axial image of the eye of a patient obtained using a two-turn solenoidal coil containing three capacitive splits per turn. Imaging parameters for this image include a 4 cm field-of-view, 256 pixel matrix, 3 mm slice thickness, 2 averages, TE 30 ms and TR 600 ms. The scan time was approximately 5 minutes and produced a high resolution image of the orbital region including the intraocular structures as well as in the retrobulbar region. In accordance with the invention, further increases in SNR in the retrobulbar region could be accomplished with the addition of further turns in the solenoidal configuration and further capacitive splits as described.

Figure 6:
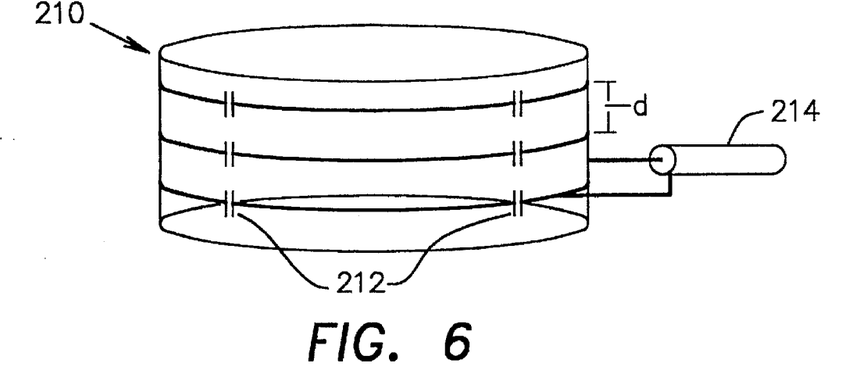
FIG. 6 shows a schematic diagram of an alternate embodiment of the surface coil of the invention.

An alternative embodiment of the coil according to the invention is shown in FIG. 6, wherein the coil 210 comprises three turns of an electrical conductor, with each of the turns provided with a predetermined number of capacitive splits 212 as previously described. A tuning and matching network (not shown) similar to that previously described may be used to couple the coil 210 to a length of coaxial cable 214 to connect to the MR imager. In this embodiment, the three turns of the coil are spaced apart at even intervals corresponding to the interturn spacing d. As previously indicated, the addition of a further turn in this embodiment in association with the capacitive splits will provide a significant increase in SNR characteristics of the coil. In accordance with the invention, further turns may be added in the solenoidal configuration to optimize SNR characteristics for a particular anatomical region as an example.

Figure 7:
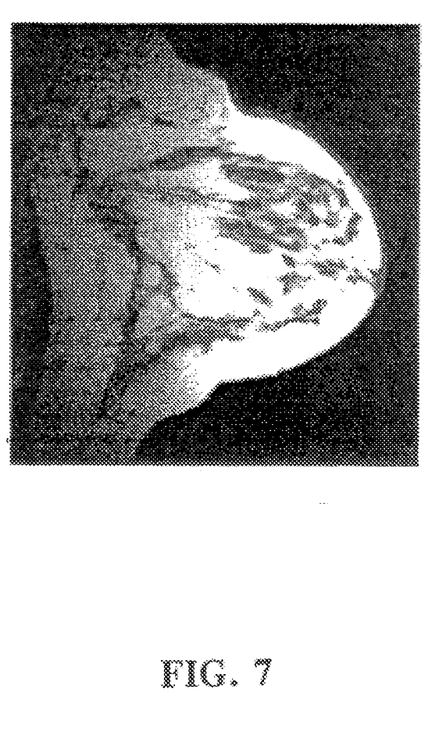
FIG. 7 is an MR image of a patients breast obtained with the coil of the invention.

In an example, the three turn coil configuration produced excellent imaging characteristics, with FIG. 7 showing a high resolution breast image obtained thereby. Imaging parameters for this image include a 16 cm field-of-view, 512×512 pixel matrix, 3 mm slice thickness, 1 average, TE 20 ms and TR 600 ms. The scan time was approximately 5 minutes and again produced a high resolution image of the breast with increased SNR.

Figure 8:
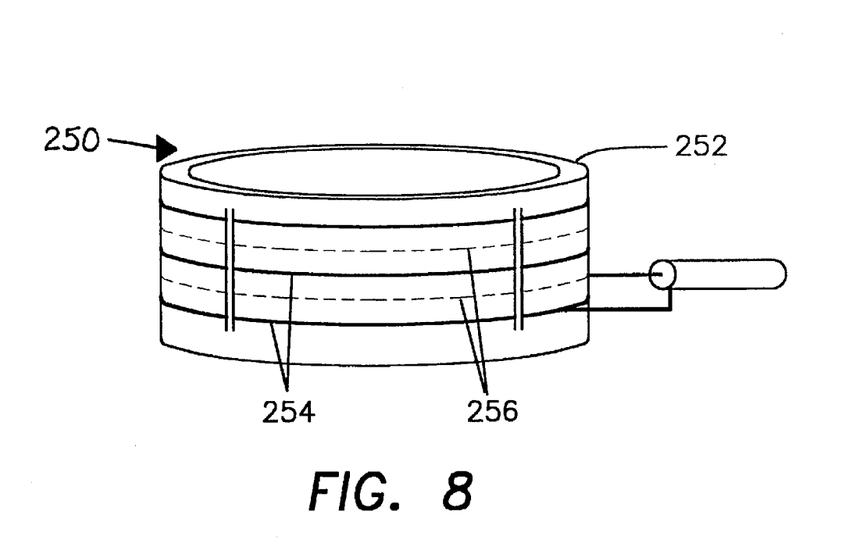
FIG. 8 shows a schematic diagram of a further embodiment of the surface coil of the invention.
Figure 9:
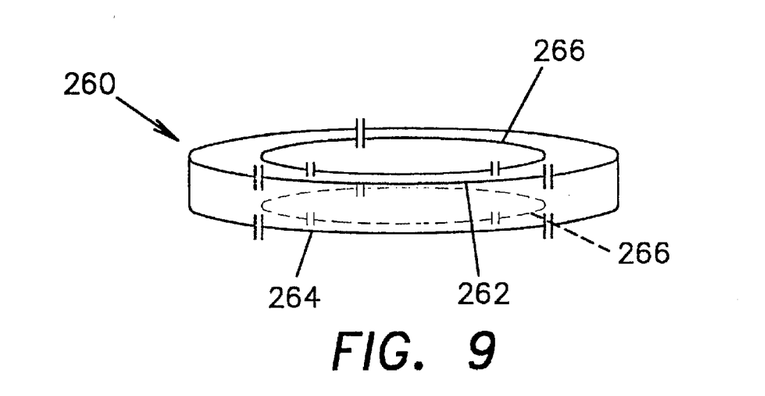
FIG. 9 shows a schematic diagram of a further embodiment of the surface coil of the invention.

As an alternative to the configurations previously shown, a multi-turn solenoidal configuration may be formed as shown in FIGS. 8–9 as further examples. In FIG. 8, the coil 250 may be formed in association with a thin-walled cylinder 252. In this configuration, a number of the coil turns may be formed on the exterior of the cylindrical form 252 as indicated at 254, while a number of further turns may be formed on the interior of the coil form 252 as indicated at 256. In this configuration, a greater number of turns may be provided in the space closest to the anatomical region of a patient adjacent to which the coil is placed for imaging. The effects of signal drop-off may thus be minimized while increasing the number of turns in the arrangement. In FIG. 9, another possible coil configuration 260 according to the invention may be formed from a double-sided printed circuit board having one turn etched in each side thereof, shown at 262 and 264. Within each of the turns 262 and 264 formed on each side of the printed circuit board, one or more additional turns 266 may be nested concentrically within the outer turn 262 or 264. In all cases, the current in each of the turns will flow in the same direction, thus avoiding self-shielding between the turns.

Based upon the foregoing, it should be evident that the multi-turn RF surface coil for receiving NMR signals improves the signal-to-noise characteristics of the coil, enabling high resolution images to be achieved for a small anatomical region of the body. Within each turn of the solenoidal configuration, a predetermined number of capacitive splits are used to reduce capacitive coupling of the coil to the body of the patient, thereby enhancing SNR characteristics. The coil configuration also significantly reduces induced resistance in the coil from the body, providing an increase in SNR. It should be evident that only several examples of possible solenoidal coil configurations have been shown herein, and the invention contemplates other solenoidal configurations forming a multi-turn coil, which utilizes capacitive splits in the manner of the invention. The associated tuning and matching circuit or other aspects of the invention may also be modified or changed as would occur to one of ordinary skill. Various modifications or changes are therefore intended to be embodied within the present invention. The invention is therefore only to be limited by the appended claims.

What is claimed is:

1. An RF surface coil for receiving magnetic resonance signals from a region to be imaged, comprising, at least two turns of an electrical conductor formed in a solenoidal configuration, with said at least two turns being positioned in spaced apart relationship defining an interturn spacing therebetween;

each of said at least two turns including a predetermined number of capacitive splits spaced at intervals along the length of said electrical conductor forming said turns, said splits being chosen to reduce capacitive coupling between said turns and between said region; and coupling means for providing electrical connection between said at least two turns and an RF receiver of a magnetic resonance imaging apparatus.

2. The RF surface coil as in claim 1, wherein, said coupling means comprises a length of coaxial cable providing electrical connection to said RF receiver, with said coil being coupled to said coaxial cable through a tuning and matching network coupled to said coil.

3. The RF surface coil as in claim 2, wherein, said tuning and matching network is used to tune the loaded phase angle of said coil to substantially 0°.

4. The RF surface coil as in claim 1, further comprising, at least one current block circuit coupled into at least one of said turns of said coil at the location of at least one of said capacitive splits, said current block forming a high impedance to induced electrical current within said electrical conductor forming said turns of said coil.

5. The RF surface coil as in claim 1, wherein, said predetermined number of capacitive splits are chosen to make the capacitive coupling of the coil to the body of a patient less than the capacitance of the coil due to the electrical components forming said coil.

6. The RF surface coil as in claim 1, wherein, said predetermined number of capacitive splits are calculated according to the following equation:

$$N = (\Delta C/(K \; C_{tot(empty)}))$$

where N is the number of capacitive splits in said turns of said coil, K is a constant representing the desired amount of reduction of capacitive coupling with respect to total capacitance, $\Delta C$ is the capacitive coupling of a coil without capacitive splits loaded with the body of a patient and $C_{tot(empty)}$ is the total series capacitance of the unloaded coil.

7. The RF surface coil as in claim 1, wherein, said at least two turns of said coil are supported within a non-magnetic housing, with said housing configured to fit in a position closely adjacent to a portion of the body to be imaged, wherein said coil provides unilateral imaging of said portion of said body, with one of said at least two turns positioned adjacent said body and the other of said at least two turns positioned at a position further from said body.

8. The RF surface coil as in claim 1, wherein, said at least two turns of said coil are supported within a non-magnetic housing, with said housing configured to fit in a position closely surrounding a portion of the body to be imaged, wherein said coil provides bilateral imaging of said portion of said body.

9. The RF surface coil as in claim 1, wherein, said electrical conductor is wound on a non-magnetic former into said solenoidal configuration along a longitudinal axis, with said at least two turns having a predetermined diameter.

10. The RF surface coil as in claim 9, wherein, said former is cylindrical having interior and exterior surfaces and said conductor is wound on to form one or more turns on each of the inside and outside surfaces.

11. The RF surface coil as in claim 1, wherein, each of said at least two turns are symmetrical about a longitudinal axis of said solenoidal configuration.

12. The RF surface coil as in claim 1, wherein, each turn of said solenoidal configuration includes at least two turns which are formed in a nested, concentric configuration.

13. The RF surface coil as in claim 1, wherein, said predetermined number of capacitive splits are spaced at substantially equal intervals along said conductor, forming a plurality of lengths of conductor, with the number of said splits chosen to the reduce the voltage induced in each of said lengths of conductor to thereby reduce the capacitive coupling of said coil to said body.

14. The RF surface coil as in claim 1, wherein, three turns of an electrical conductor are formed in said solenoidal configuration with each of said turns including a predetermined number of capacitive splits.

15. A method of magnetic resonance imaging of a portion of a body of a patient, comprising the steps of:

(a) providing a radio frequency (RF) surface coil with a solenoidal configuration having at least first and second turns being spaced apart along a longitudinal axis, with said RF surface coil having a predetermined number of capacitive splits, said splits being chosen to reduce capacitive coupling between said turns and between said region;

(b) positioning said surface coil adjacent said portion of a body of a patient;

(c) receiving nuclear magnetic resonance signals from said portion of said body by means of said radio frequency surface coil; and (d) reconstructing an image of at least a portion of said body from which magnetic resonance signals are received.

16. The method of magnetic resonance imaging as in claim 15, wherein, said coil is positioned with a first turn adjacent said portion of the body, with said at least second turn positioned a distance from the body, with said longitudinal axis of said coil directed toward said anatomical region.

17. The method of magnetic resonance imaging as in claim 15, wherein, said coil is positioned around a portion of said body with said anatomical region positioned within said solenoidal configuration.

18. The method of magnetic resonance imaging as in claim 15, wherein, said coil is formed of an electrical conductor and said predetermined number of capacitive splits are spaced at substantially equal intervals along said conductor, thereby effectively separating said coil into a number of lengths of conductor, with said splits and chosen to the reduce the voltage induced in each of said lengths of conductor to thereby reduce the capacitive coupling of said coil to said body.

19. The method of magnetic resonance imaging as in claim 15, wherein, said coil is coupled to an RF receiver of a magnetic resonance imaging apparatus through a length of a coaxial conductor, with said coil coupled to said coaxial cable through a tuning and matching network which substantially matches the impedance of the coil to the impedance of said coaxial cable and an amplifier associated with said RF receiver.

20. A method for improving the signal to noise ratio of a multiturn RF surface coil for receiving magnetic resonance signals from a region to be imaged, comprising, at least two turns of an electrical conductor formed in a solenoidal configuration, with said at least two turns being positioned in spaced apart relationship defining an interturn spacing therebetween;

each of said at least two turns including a predetermined number of capacitive splits spaced at intervals along the length of said electrical conductor forming said turns, said splits being chosen to reduce capacitive coupling between said turns and between said region; and coupling means for providing electrical connection between said at least two turns and an RF receiver of a magnetic resonance imaging apparatus.

* * * * *

UNITED STATES PATENT AND TRADEMARK OFFICE
CERTIFICATE OF CORRECTION

PATENT NO. : 5,646,530
DATED : July 8, 1997
INVENTOR(S) : Susan A. Strenk, et al.

It is certified that error appears in the above-indentified patent and that said Letters Patent is hereby corrected as shown below:

Column 6, line 35, please delete "$R=nr_o+(n/N)^2rb$" and insert therefore --$R=nr_c+(n/N)^2r_b$--.

Column 9, line 49, please delete "$N=(\Delta C/(K\ C_{tot/empty}))$" and insert therefore --$N=(\Delta C/(K\ C_{tot(empty)}))$--.

Signed and Sealed this

Twenty-eighth Day of October, 1997

Attest:

BRUCE LEHMAN

*Attesting Officer*  *Commissioner of Patents and Trademarks*